United States Patent [19]

Ohba et al.

[11] Patent Number: 5,522,412
[45] Date of Patent: Jun. 4, 1996

[54] VACUUM TREATMENT APPARATUS AND A CLEANING METHOD THEREFOR

[75] Inventors: Takayuki Ohba; Toshiya Suzuki, both of Kawasaki; Seishi Murakami, Kofu, all of Japan

[73] Assignees: Tokyo Electron Kabushiki Kaisha, Tokyo; Fujitsu Limited, Kanagawa-Ken, both of Japan

[21] Appl. No.: 289,117

[22] Filed: Aug. 11, 1994

[30] Foreign Application Priority Data

Aug. 11, 1993 [JP] Japan ..................................... 5-220680

[51] Int. Cl.⁶ ........................................................ B08B 3/02
[52] U.S. Cl. .................. 134/104.1; 134/117; 134/166 R; 134/902; 118/70
[58] Field of Search ................................. 134/104.1, 107, 134/117, 166 R, 902; 118/70; 154/385

[56] References Cited

U.S. PATENT DOCUMENTS

| | | | |
|---|---|---|---|
| 4,316,750 | 2/1982 | Gengler | 134/104.1 |
| 5,027,841 | 7/1991 | Brunsbach et al. | 134/113 |
| 5,069,235 | 12/1991 | Vetter et al. | 134/113 |
| 5,095,925 | 3/1992 | Elledge et al. | 134/104.1 |
| 5,193,560 | 3/1993 | Tanaka et al. | 134/107 |
| 5,314,509 | 5/1994 | Kato et al. | 134/902 |
| 5,388,601 | 2/1995 | Mansur | 134/107 |

FOREIGN PATENT DOCUMENTS

| | | | |
|---|---|---|---|
| 3-4530 | 1/1991 | Japan | 118/70 |
| 4-56770 | 2/1992 | Japan | |

*Primary Examiner*—Frankie L. Stinson
*Attorney, Agent, or Firm*—Beveridge, DeGrandi, Weilacher & Young

[57] ABSTRACT

When an object of treatment is subjected to, for example, a gas treatment in an airtight chamber, reaction products adhere to the inner wall surface of the chamber, an object holder therein, and the corner portions of the chamber. When a cleaning medium is injected into the chamber, according to the present invention, the reaction products are dissolved in the cleaning medium by hydrolysis. Thereafter, the cleaning medium is discharged from the chamber. Then, the chamber is heated and evacuated, so that water vapor is discharged to provide a predetermined degree of vacuum, whereupon the treatment can be started anew. Therefore, a wiping operation can be omitted. Moreover, the reaction products remaining at the corner portions of the chamber can be removed without forming a source of polluted particles, so that the necessity of overhauling can be obviated. Thus, fully automatic cleaning, so to speak, can be effected, and the chamber need not be open to the atmosphere, so that the throughput can be improved.

21 Claims, 7 Drawing Sheets

VACUUM TREATMENT APPARATUS AND A CLEANING METHOD THEREFOR

BACKGROUND OF THE INVENTION

The present invention relates to a vacuum treatment apparatus and a cleaning method therefor.

In a semiconductor device manufacturing process, semiconductor wafers are subjected to various treatments, such as CVD, etching, ashing, etc., using treatment gases in a vacuum. In carrying out these vacuum treatments, reaction products resulting from reaction between components in the treatment gases or between the treatment gas components and the components of the wafer surface adhere to the susceptors of the wafers and the wall portion of a treatment chamber. Since these adhering products would form a source of particles, they should be removed.

Conventionally, as is described in Jpn. Pat. Appln. KOKAI Publication No. 4-56770, for example, a cleaning gas is introduced into the treatment chamber after plasma CVD is carried out by using a parallel-plate CVD apparatus. At the same time, voltage is applied between electrodes to convert the gas into a plasma. The interior of the treatment chamber is cleaned with use of the plasma.

According to this method, however, the region where the plasma is generated is limited, so that the adhering products cannot be thoroughly removed from the side faces of the susceptors and the base and corner portions of the treatment chamber. Moreover, this method is not applicable to an apparatus in which the treatment gases are caused to react without using electrical energy.

In filling contact holes of MOS transistors, for example, TiN (titanium nitride) films for use as barrier layers are interposed between aluminum and tungsten layers and diffusion layers. $TiCl_4$ gas and $NH_3$ gas are fed into the treatment chamber, and the wafers are heated to, for example, 500° C. to 750° C. TiN is formed as $TiCl_4$ and $NH_3$ are caused to react by the resulting heat. In this case, $NH_4Cl$ (ammonium chloride) is formed as a reaction by-product besides TiN. Since $NH_4Cl$ solidifies at a temperature of about 120° C. or below, and in a substantially decompressed vacuum, it adheres to the inner wall surfaces of the treatment chamber and pipes at 120° C. or below. The adhering $NH_4Cl$ powders and scatters during evacuation, thus lowering the degree of vacuum and contaminating the wafers.

Since the TiN films are formed by thermal CVD, as mentioned before, plasma cleaning requires additional electrodes. For the aforesaid reason, however, $NH_4Cl$ cannot be thoroughly removed even with use of those additional electrodes. Accordingly, the treatment chamber is drained periodically. According to this method, however, the corner portions cannot be cleaned satisfactorily.

If the build-up at the corner portions of the treatment chamber increases, therefore, the apparatus must be disassembled to be cleaned. More specifically, the top plate or the like of the treatment chamber is removed to expose its interior to the atmosphere, and various components are detached. Then, an operator directly wipes the inner wall surface and the like of the treatment chamber with a wiper soaked with a cleaning agent, such as pure water. After this wiping operation is finished, the treatment chamber is evacuated. When a predetermined degree of vacuum is attained, films can be formed again.

Since sputtering requires a degree of vacuum of about $10^{-8}$ Torr, however, each cycle of evacuation takes a whole day and night. On the other hand, the CVD requires a degree of vacuum of about $10^{-4}$ Torr, so that each cycle of evacuation takes about half a day, that is, the downtime is very long. Moreover, the reaction products deposited at the corner portions of the treatment chamber cannot be removed by the wiping operation, and they form a source of polluted particles, thereby lowering the yield of production of devices. Conventionally, therefore, the wiping operation should be combined with periodical overhauling, including operations for disassembling, cleaning, and assembling the whole treatment chamber. In some cases, this overhauling requires several days, so that the downtime is very long. Thus, there has conventionally been a demand for the improvement of the operating efficiency.

SUMMARY OF THE INVENTION

The object of the present invention is to provide a vacuum treatment apparatus and a cleaning method therefor, in which reaction products adhering to various parts of the interior of a treatment chamber, including the corner portions thereof, can be thoroughly removed with ease, so that the necessity of overhauling as well as wiping operation can be obviated, and the downtime can be reduced substantially to zero, whereby the throughput can be improved.

A vacuum treatment apparatus according to the present invention is an apparatus for carrying out a predetermined process in an airtight chamber having a substantial vacuum, comprising: supply means for supplying a cleaning medium into said chamber after finishing the predetermined process; cleaning medium discharge means for discharging the cleaning medium from said chamber; and heating means for heating and drying the interior of said chamber at least after discharging a predetermined quantity of the cleaning medium.

When an object of treatment is subjected to, for example, a gas treatment in the treatment chamber, in this arrangement, reaction products adhere to the inner wall surface of the treatment chamber, an object holder therein, and the corner portions of the chamber. When the cleaning medium is injected into the treatment chamber, according to the present invention, the reaction products are dissolved in the cleaning medium by hydrolysis. Thereafter, the cleaning medium is discharged from the treatment chamber. Then, the treatment chamber is heated and evacuated, so that water vapor is discharged to provide a predetermined degree of vacuum, whereupon the treatment can be started anew.

According to the present embodiment, therefore, a wiping operation, which has conventionally been required, can be omitted. Moreover, the reaction products remaining at the corner portions of the treatment chamber can be removed without forming a source of polluted particles, so that the necessity of overhauling can be obviated.

Thus, fully automatic cleaning, so to speak, can be effected, and the treatment chamber need not be open to the atmosphere, so that the throughput can be improved. Also, the cleaning operation is safe because an operator can never touch any sub-products (e.g., acid) which are derived from the reaction products. Since the cleaning medium penetrates all the ins and outs of precision components and the like, moreover, those minute portions can be thoroughly cleaned without requiring operations for disassembling and assembling the treatment chamber. Accordingly, the downtime can be very short, and the running cost can be reduced remarkably.

DETAILED DESCRIPTION OF THE PREFERRED EMBODIMENTS

Figure 1:
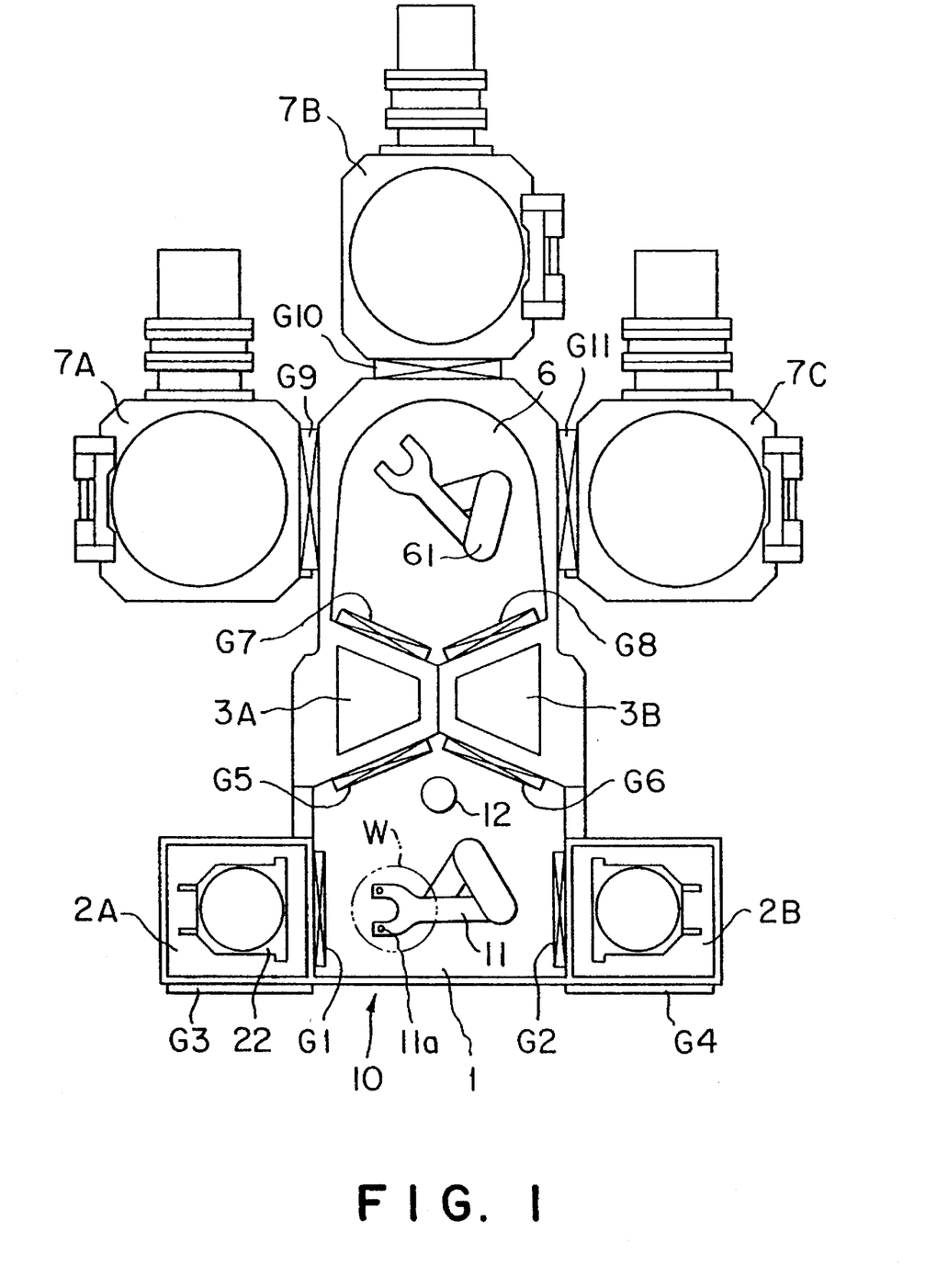
FIG. 1 is a plan view of a vacuum treatment apparatus according to the present invention.
Figure 2:
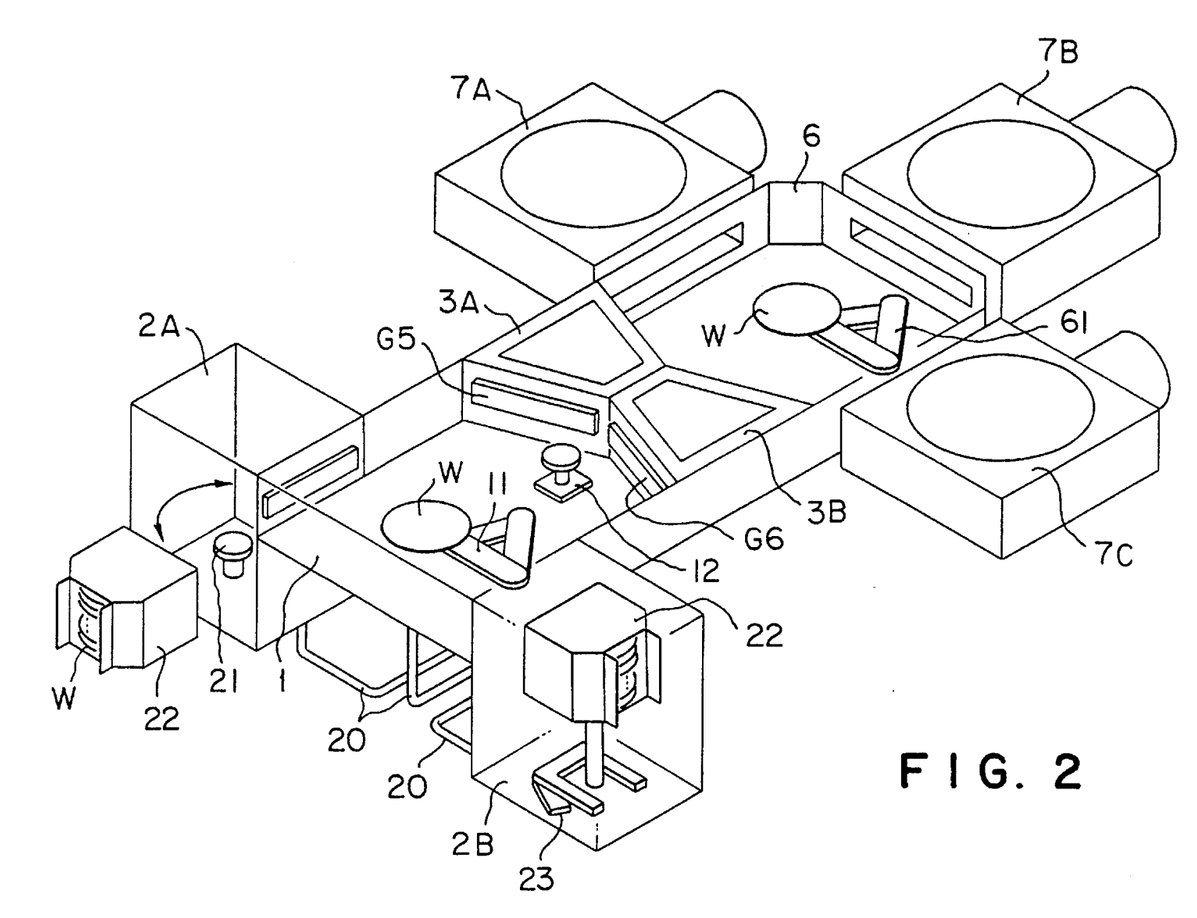
FIG. 2 is a schematic perspective view of the vacuum treatment apparatus shown in FIG. 1.

Referring now to FIGS. 1 and 2, a vacuum treatment apparatus according to the present invention will be described.

First and second cassette chambers 2A and 2B are connected individually to the opposite sides of a first transfer chamber 1 through gate valves G1 and G2, respectively. The cassette chambers 2A and 2B, which serve as loading and unloading ports of the vacuum treatment apparatus, are each provided with a cassette stage 21 capable of up-and-down motion.

The first transfer chamber and the cassette chambers 2A and 2B have an airtight structure, and serve as loader chambers. The chambers 2A and 2B have gate doors G3 and G4, respectively, for communication with the outside (ambient atmosphere in a workroom), and are provided with a loading/unloading robot 23 having a holding member each. As shown in FIG. 2, the robots 23 individually load wafer cassettes 22, turned forward outside, into their corresponding cassette chambers 2A and 2B, and then set them sideways. After the cassettes 22 are loaded into the cassette chambers 2A and 2B, they are raised to a predetermined position by means of their corresponding cassette stages 21. As shown in FIG. 2, moreover, gas supply pipes 20 for supplying an inert gas, such as nitrogen gas, are connected individually to the first transfer chamber 1 and the cassette chambers 2A and 2B. Thus, the chambers 1, 2A and 2B are charged with an inert gas atmosphere by means of a pressure regulator (not shown).

Arranged in the first transfer chamber 1 are first transfer means 11, formed of, e.g., a multi-joint arm, and a rotating stage 12 for aligning the center and orientation flat of each wafer W. The rotating stage 12, in conjunction with light emitting and sensing units (not shown), constitute positioning means. The first transfer means 11 transfers wafers between the cassettes in the first and second cassette chambers 2A and 2B, the rotating stage 12, and spare vacuum chambers (mentioned later). Suction holes 11a for attracting the wafer W by vacuum suction are formed individually in two distal end portions of the arm which constitutes a wafer holding portion. The suction holes 11a are connected to a vacuum pump (now shown) by means of suction channels (not shown).

First and second spare vacuum chambers 3A and 3B are connected to the back of the first transfer chamber 1 through gate valves G5 and G6, respectively. The vacuum chambers 3A and 3B are charged with an inert gas atmosphere, such as nitrogen gas, and may be used to preheat the wafers W in some cases.

A second transfer chamber 6 is connected to the rear side of the first and second spare vacuum chambers 3A and 3B through gate valves G7 and G8.

Located in the second transfer chamber 6 is second transfer means 61, which is formed of, e.g., a multi-joint robot, and is used to transfer the wafers between the first and second spare vacuum chambers 3A and 3B and three vacuum treatment chambers 7A, 7B and 7C, which will be mentioned later.

The three vacuum treatment chambers 7A, 7B and 7C are connected to the left- and right-hand portions and rear portion of the second transfer chamber 6 through gate valves G9, G10 and G11, respectively. In the treatment chamber 7A, a titanium film is formed on a wafer with a fine pattern thereon by sputtering at a temperature of 400° to 500° C., for example. In the treatment chamber 7B, a tungsten layer is formed on the fine pattern by chemical vapor deposition (CVD), for example. In the treatment chamber C, moreover, the tungsten layer is etched back. In this case, the surface of the wafer W is treated in succession in the vacuum treatment chambers 7A to 7C. Alternatively, however, the chambers 7A to 7C may be designed for the same treatment, e.g., CVD.

Further, the first and second cassettes 22 may be arranged in the first transfer chamber 1, while the spare vacuum chambers may be reduced to one in number. The wafers may be kept in a vacuum as they are transferred between the cassettes, first transfer chamber 1, and the spare vacuum chambers. In a gas atmosphere at an atmospheric pressure or higher pressure, thoroughly dehydrated dry air may, for example, be used in place of the inert gas as the ambient gas. When using the inert gas, argon gas or carbonic acid gas may be substituted for nitrogen gas. Moreover, the vacuum treatment chambers may be two or four in number, and LCD substrates or the like may be used as objects of treatment. In the vacuum treatment chambers, furthermore, sputtering, CVD, etching, oxidation, diffusion, etc. may be conducted.

Figure 3:
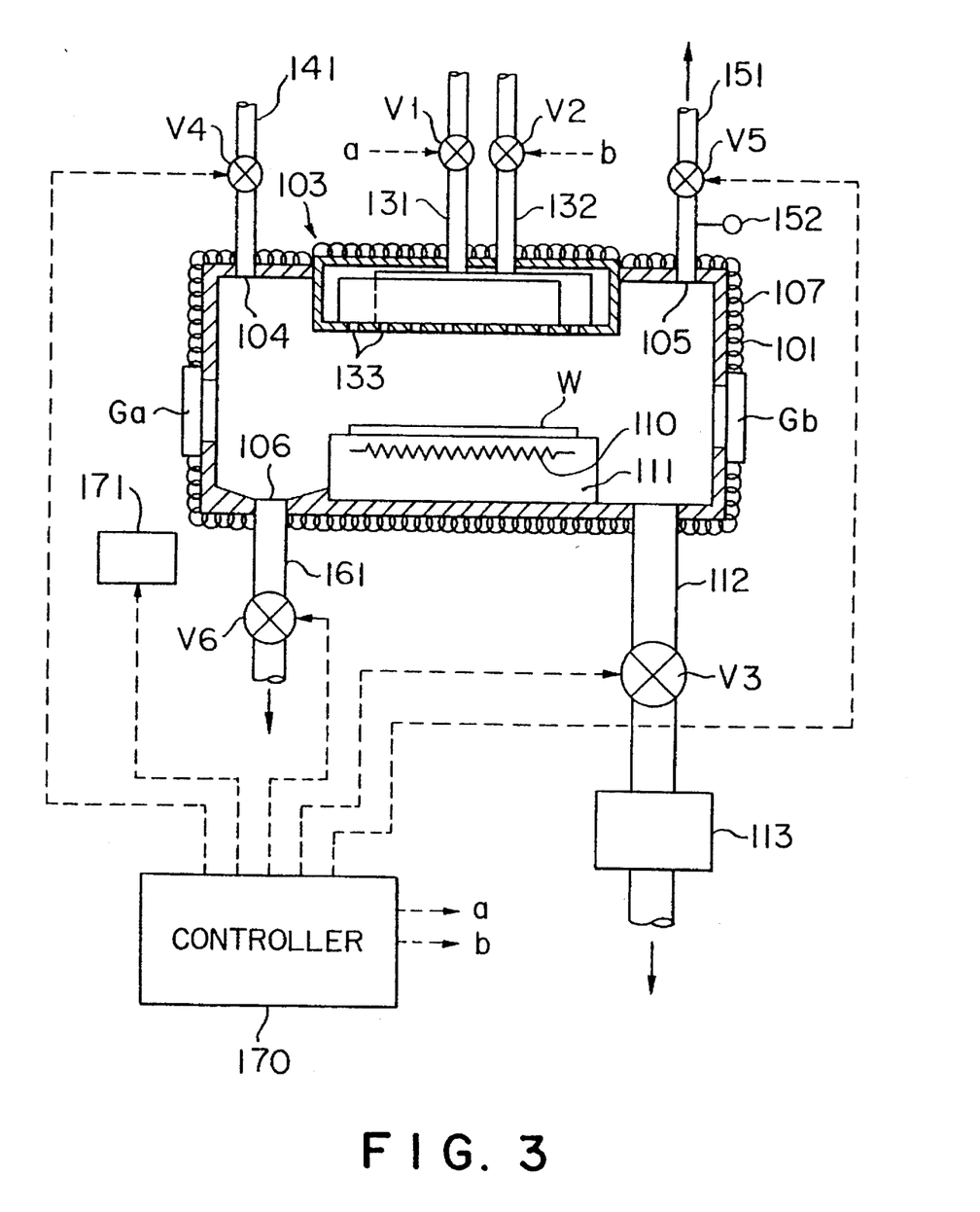
FIG. 3 is a sectional view of a CVD treatment apparatus as a vacuum treatment apparatus according to a first embodiment of the invention.
Figure 4:
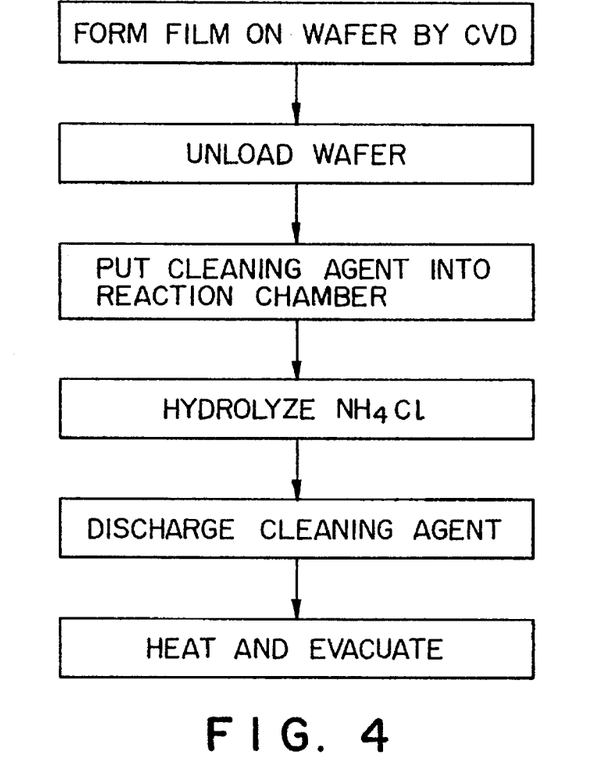
FIG. 4 is a flow chart for illustrating a cleaning method for the vacuum treatment apparatus according to the first embodiment of the invention.

Referring now to FIGS. 3 and 4, a vacuum treatment apparatus, e.g., a leaf-type thermal CVD apparatus, according to a first embodiment of the present invention will be described.

In FIG. 3, a wafer mount 111 for holding a wafer W as an object of treatment is located at the bottom of a vacuum treatment chamber 101. The mount 111 is provided with a heater 110 for heating the wafer W to a predetermined temperature. At the top portion of the treatment chamber 101, a treatment gas supply section 103 for feeding treatment gases into the chamber 101 is located opposite the wafer mount 111. The supply section 103 is composed of first and second gas supply pipes 131 and 132 for supplying, e.g., $TiCl_4$ gas and $NH_3$ gas as treatment gases, respectively. The respective extreme end portions of the pipes 131 and 132 are connected to a gas injection plate 133. The first gas supply pipe 131 is connected to gas sources (not shown) for $TiCl_4$ and $NH_3$ through valves V1 and V2, respectively.

One end of an exhaust pipe 112 is connected to the base portion of the treatment chamber 101, and the other end to a vacuum pump 113 through a valve V3. Gate valves Ga and Gb for opening and closing inlet and outlet ports are attached individually to side walls of the chamber 101.

The ceiling portion of the treatment chamber 101 is provided with an injection hole 104, through which a cleaning medium, e.g., pure water, is injected into the chamber 101, and a vent hole 105 through which the chamber 101 opens into the atmosphere. One end of a cleaning medium injection pipe 141 fitted with a valve V4 is connected to the injection hole 104, while one end of a ventilating pipe 151 fitted with a valve V5 is connected to the vent hole 105. The other end of the injection pipe 141 is connected to a pure water source (not shown), while the other end of the ventilating pipe 151 opens into the atmosphere over a reservoir (not shown) lest the cleaning medium flow into the workroom when it overflows, for example. Also, the pipe 151 serves for ventilation when the cleaning medium is injected or discharged. In the present embodiment, however, the ventilating pipe 151 is fitted with a level gage 152 in order to check to see if the treatment chamber 101 is filled with the cleaning medium when the cleaning medium is injected.

The bottom wall of the treatment chamber 101 has a discharge port 106 through which the cleaning medium is discharged. The discharge port 106 is connected with a cleaning medium discharge pipe 161 which is provided with a valve V6. The inner surface of the bottom wall of the chamber 101 is declined toward the discharge port 106 lest the cleaning medium remain on the bottom wall when it is discharged. Moreover, a heater 107, formed of a resistance heating wire, for example, is arranged so as to cover the outer wall of the treatment chamber 101 and that portion of the outer peripheral surface of the exhaust pipe 112 which extends up to the valve V3. This CVD apparatus is furnished with a controller 170 for controlling the individual valves V1 to V6 and a power supply unit 171 for the heater 107. A detection signal from the level gage 152 attached to the ventilating pipe 151 is applied to the input of the controller 170.

In a specific arrangement, the heater 107 surrounds the whole treatment chamber 101. If the heater 110 is not contained in the wafer mount 111, as in an arrangement for etching, however, the heater 107 may be located in the mount 111. If necessary, the heater 107 may be also provided in the shower head 133.

Further, the heater 107 need not be formed of a resistance heating wire, and may be made of ceramics or any other suitable materials. Moreover, the heater 107 may be embedded in the wall or attached to the outside of the outer wall, as shown in FIG. 3. Furthermore, the heater 107 may be located in- or outside the wall, or wound around the outer wall, as shown in FIG. 3. The temperature of the heater 107 is a temperature at which the cleaning medium evaporates. Therefore, it is 100° C. or more in the case where the cleaning medium is pure water.

The following is a description of the operation of the first embodiment.

First, the wafer W is loaded from a load locking chamber into the treatment chamber 101 through the gate valve Ga. Then, the wafer W is heated to, for example, 500° to 750° C. by means of the heater 110 in the wafer mount 111. The valve V3 is opened, and the chamber 101 is exhausted to a predetermined degree of vacuum by means of the vacuum pump 113. The valves V1 and V2 are then opened, and TiCl$_4$ and NH$_3$ gases are fed into the chamber 101 through the gas supply pipes 131 and 132. As a result, TiCl$_4$ and NH$_3$ react in the manner indicated by the following reaction formula, whereupon a TiN film is formed on the surface of the wafer W.

After the treatment, the gate valve Gb is opened, and the wafer W is carried out into the load locking chamber.

In this reaction, NH$_4$Cl is formed as a reaction by-product and adheres to the inner wall surface of the treatment chamber 101 and the surface of the wafer mount 111. As the number of treated wafers increases, the build-up of NH$_4$Cl increases. Before the CVD is adversely affected by the separation of NH$_4$Cl, the interior of the treatment chamber 101 is cleaned following the steps of procedure shown in FIG. 4.

The valves V4 and V5 are opened with the gate valves Ga and Gb and the valves V1, V2, V3 and V6 closed. The cleaning medium, e.g., pure water, is poured into the treatment chamber 101 through the cleaning medium injection pipe 141. As this is done, air in the chamber 101 escapes through the vent hole 105 and the ventilating pipe 151 into the atmosphere.

When the treatment chamber 101 is filled with the cleaning medium, the medium gets into the ventilating pipe 151. Thereupon, the level gage 152 detects the level of the cleaning medium, and delivers a detection signal to the controller 170. In response to a control signal from the controller 170, the valve V4 in the cleaning medium injection pipe 141 is closed, so that the injection of the cleaning medium is stopped. As a result, NH$_4$Cl adhering to the inner wall surface of the treatment chamber 101 is hydrolyzed and dissolved. The valve V6 is opened in, for example, 10 minutes after the valve V4 is closed, and the cleaning medium in the treatment chamber 101 is discharged to the outside through the discharge port 106 and the cleaning medium discharge pipe 161.

A measuring device for measuring the specific resistance of the cleaning medium is attached to the outlet of the discharge port 106. The measured specific resistance is compared with the initial specific resistance of the cleaning medium injected through the valve V4, whereby the presence of residue is discriminated. If the specific resistance of the discharged pure water is lower than the initial one, it is concluded that the by-product of the reaction still remains in the treatment chamber 101. Accordingly, the by-product is fully hydrolyzed, whereupon it is concluded that there is no residue in the treatment chamber 101.

After a predetermined quantity of the cleaning medium is discharged from the treatment chamber 101, the heater 107 is switched on to heat the chamber 101. When the treatment chamber 101 is thus heated and decompressed, the cleaning medium therein evaporates. The resulting vapor is discharged through the vent hole 105 and the ventilating pipe 151. The wetness of the vapor in the pipe 161 is detected by means of a dew indicator (not shown) or the like. When a predetermined value is reached by the wetness of the vapor, therefore, the valves V5 and V6 are closed, the valve V3 is opened, and the treatment chamber 101 is evacuated through the exhaust pipe 112 by means of the vacuum pump 113. This is done in order to prevent dew condensation in the vacuum pump when the high-wetness vapor is sucked in by means of the pump.

In this sequence of operations, all the processes of detection of the cleaning medium are confirmed by the use of detecting means such as a flowmeter (not shown) which is attached to the cleaning medium discharge pipe 161, for example, and the valves V6 and V3 are operated by means of the controller 170. At the same time, an ON command is delivered to the power supply unit 171.

When the predetermined value is reached by the degree of vacuum in this manner, the valve V3 is closed, the gate valve Ga is opened, and the wafer W is loaded into the treatment chamber 101.

According to the first embodiment, reaction products adhering to the inner wall surface of the treatment chamber 101 are washed off with the cleaning medium which fills the chamber 101. Thus, the inside corner of the treatment chamber 101 and the interior of the exhaust pipe 112 can be throughly cleaned, and the cleaning operation is easy. Since the treatment chamber 101 need not be disassembled, moreover, operations for disassembly, assembly, and leakage check are unnecessary, the downtime is short, and the throughput is improved.

According to the present embodiment, furthermore, the cleaning medium is discharged after the treatment chamber 101 is filled once with it. Alternatively, however, the cleaning medium may be supplied to the chamber 101 to keep its level fixed as it is discharged. Although the capacity of the treatment chamber 101 is, for example, 20 liters in this case, it may range 10 to 100 liters.

It is necessary, moreover, only that the level gage 152 be mounted in the highest position that can be subjected to contamination by the reaction products. More specifically, the level gage 152 must only be mounted in a position such that the shower head 133 is immersed in the water, and the gas supply pipes 131 and 132 over the head 133 are not.

The treatment chamber 101 is formed of aluminum, the shower head 133 is of stainless steel or nickel, and the wafer mount 11 is of stainless steel, aluminum, or quartz. Even though the cleaning medium, such as pure water, is poured into the treatment chamber 101, therefore, it never damages the chamber, shower head, or mount.

Although pure water is used as the cleaning medium, which may be fluid, for ammoniac materials such as ammonium chloride, organic solvents, such as ethanol, alcohol, etc., are used for organic metals. For TEOS which forms a layer insulating film, moreover, organic solvents, such as ethanol, alcohol, etc., are used. Thus suitable dissolvable cleaning mediums may be selected depending on the reaction products.

When the cleaning medium or pure water is supplied to the treatment chamber 101, it quickly reacts to an ammoniac material, so that it should only be discharged at once without requiring any substantial water immersion time. In the case of an organic solvent, it is necessary only that the water immersion time be adjusted according to the value in a concentration meter.

The injection hole 104, which specifically is a nozzle, may be a shower head. Also, the hole 104 may be arranged so that the cleaning medium can be sprayed superfluously on those local portions which require the cleaning medium in large quantities. Moreover, the injection hole 105 may be designed so that the cleaning medium fed through the port 104 can remove the reaction products under pressure from injection.

Figure 5:
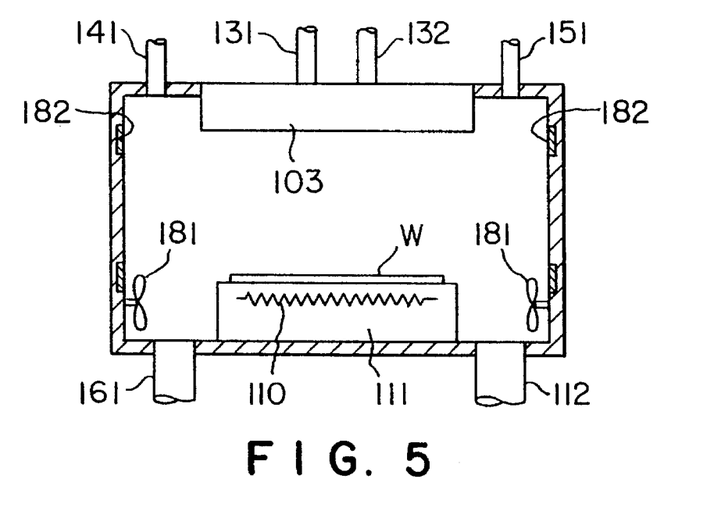
FIG. 5 is a sectional view of a CVD treatment apparatus as a vacuum treatment apparatus according to a modification of the first embodiment of the invention.

FIG. 5 shows a modification of the present embodiment, in which stirrers 181 for stirring the cleaning medium are mounted on, for example, those portions of the inner wall of the treatment chamber 101 near the bottom portion. In this case, the stirrer 181 must only be located in a position such that it does not obstruct flows of the treatment gases. The stirrer 181 serves to improve the cleaning effect.

As shown in FIG. 5, moreover, ultrasonic oscillators 182 for vibrating the cleaning medium may be embedded in the inner wall of the treatment chamber 101. Also, the valves V4 to V6 may be operated manually during the cleaning operation. Moreover, part of the ventilating pipe 151 may be formed of a light transmitting material, for example, so that the liquid level can be visually observed during the operation for closing the valve V4 and the like, instead of using the level gage 152. The cleaning medium is not limited to pure water, and may be a hydrogen peroxide solution or the like.

Since $NH_4Cl$ is created as a sub-product also when $NH_3$ gas and $SiH_2Cl_2$ gas are used to form a $Si_3N_4$ film, the present invention is also serviceable for this case. Moreover, the invention is applicable to the cases where other reaction products than $NH_4Cl$ to be hydrolyzed by means of the cleaning medium adhere to the inner wall surface of the treatment chamber. Furthermore, the invention may be applied to any other apparatuses than the thermal CVD apparatus, including a plasma CVD apparatus, which forms a film by using a plasma, etching apparatus, and ashing apparatus, for example.

Thus, according to the first embodiment, the reaction products adhere to the inner wall surface of the treatment chamber, the wafer mount, etc. when the object of treatment is subjected to a gas treatment in the treatment chamber. When the cleaning medium is injected into the treatment chamber, in the present embodiment, however, the reaction products are dissolved in the cleaning medium by hydrolysis and removed. Thereafter, the cleaning medium is discharged from the treatment chamber, and the chamber is heated as it is exhausted or evacuated. After the predetermined degree of vacuum is attained, the object of treatment from the load locking chamber is carried into the treatment chamber. In this manner, the interior of the treatment chamber can be easily cleaned in a very short time.

According to the present embodiment, therefore, wiping operation, which has conventionally been required, can be omitted. Moreover, the reaction products remaining at the corner portions of the treatment chamber can be removed without forming a source of polluted particles, so that the necessity of overhauling can be obviated.

Thus, fully automatic cleaning, so to speak, can be effected, and the treatment chamber need not be open to the atmosphere, so that the throughput can be improved. Also, the cleaning operation is safe because an operator can never tough any sub-products (e.g., acid) which are derived from the reaction products. Since the cleaning medium penetrates all the ins and outs of precision components and the like, moreover, those minute portions can be thoroughly cleaned without requiring operations for disassembling and assembling the treatment chamber. Accordingly, the downtime can be very short, and the running cost can be reduced remarkably.

Figure 6:
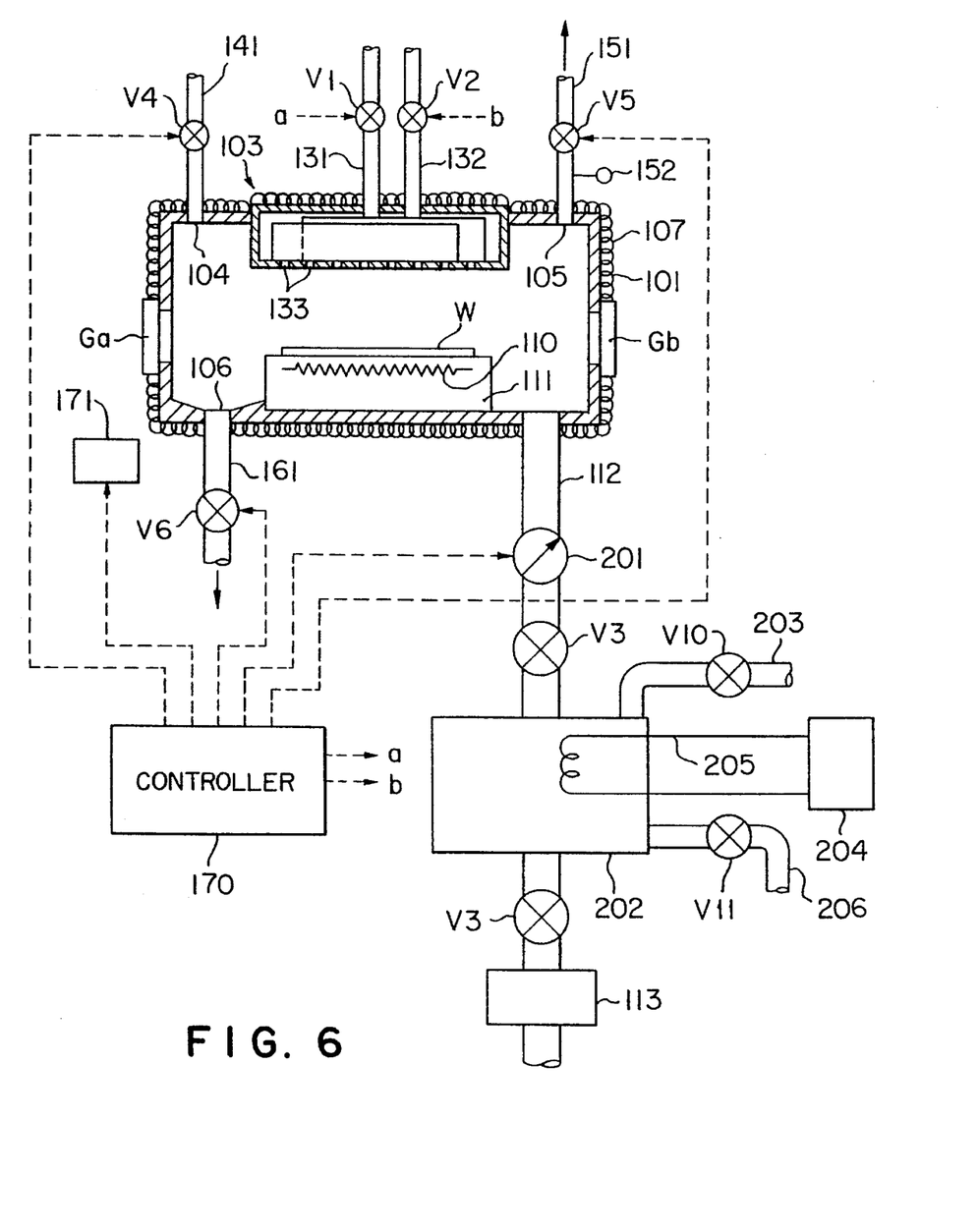
FIG. 6 is a sectional view of a CVD treatment apparatus as a vacuum treatment apparatus according to a second embodiment of the invention.

Referring now to FIG. 6, a vacuum treatment apparatus, e.g., a thermal CVD treatment apparatus, according to a second embodiment of the present invention will be described.

The CVD treatment apparatus according to the second embodiment is constructed basically in the same manner as the first embodiment. The second embodiment differs from the first embodiment only in that it is provided with a trapping mechanism for the reaction products and a heating mechanism for a gas exhaust system.

The reaction product trapping mechanism is constructed in the following manner. The gas exhaust system is provided with a throttle valve 201 for automatic pressure control. The exhaust pipe 112 is fitted with a trapping container 202, which is connected with a cleaning medium supply pipe 203 through a valve V10. Also, the container 202 is connected with a cooler 204 and a drain pipe 206 through a heat exchanger 205 and a valve V11, respectively.

In this arrangement, when condensative gases used according to the present embodiment enter the trapping container 202, they are condensed by cool air from the cooler 204. At the same time, the cleaning medium is supplied from the cleaning medium supply pipe 203. The condensed gases and cleaning medium are discharged through the drain pipe 206. Thus, the gases supplied to the vacuum pump are cleared of unnecessary gases, so that the pump can be prevented from going wrong.

The heating mechanism for the gas exhaust system is constructed so that the throttle valve 201 for automatic pressure control and the upper gate valve V3 are heated by means of heating means.

Figure 7A:
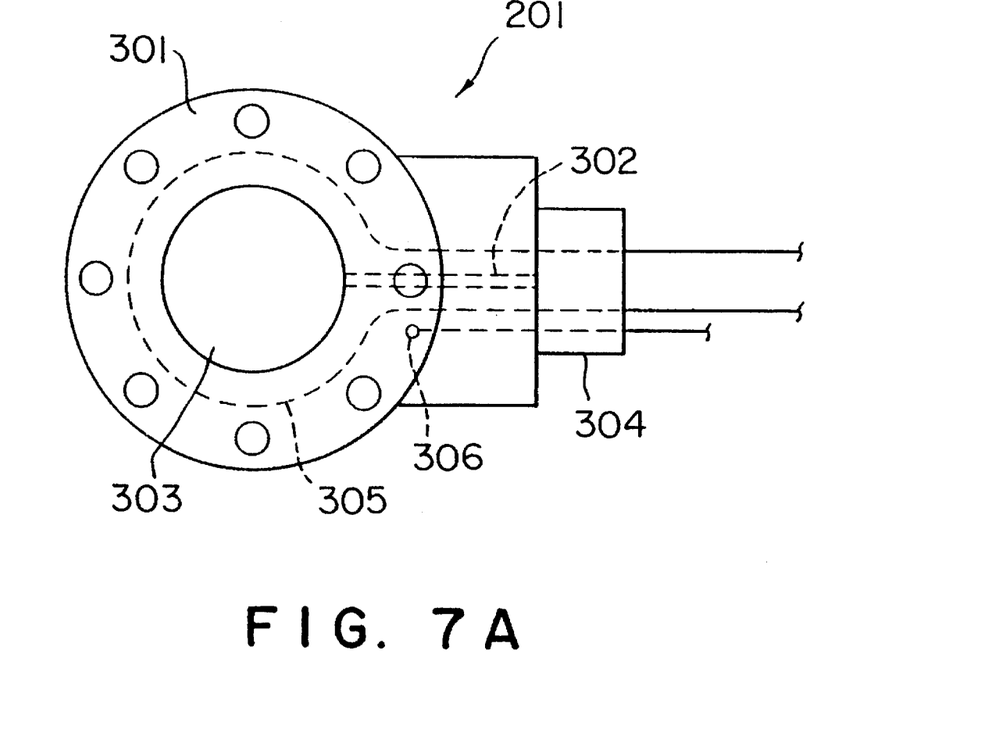
FIG. 7A is a front view of a throttle valve for an automatic pressure control.
Figure 7B:
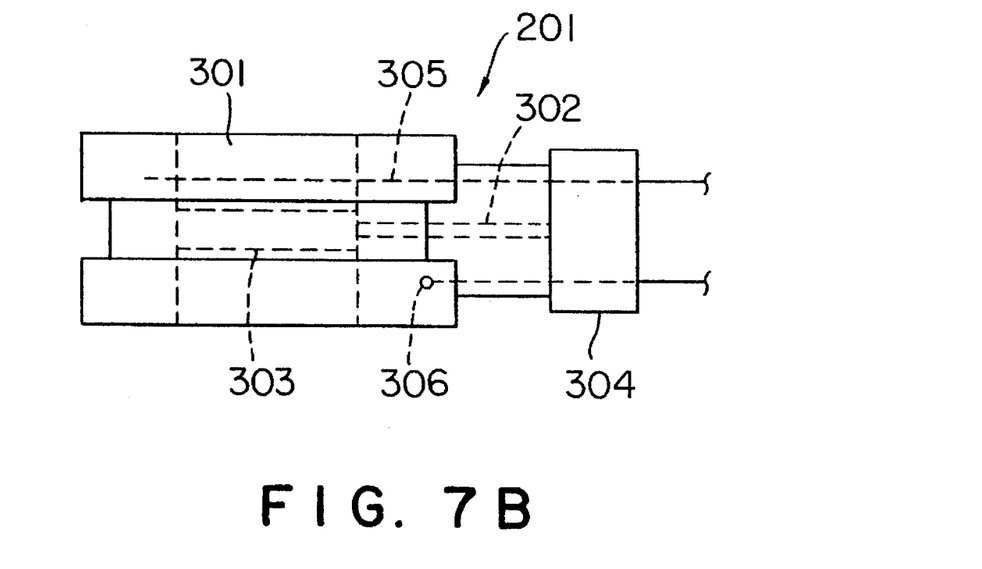
FIG. 7B is a side view thereof.

The throttle valve 201 is constructed as shown in FIG. 7A and 7B. A throttle valve housing 301 is provided with valve body 303 which is rotatably supported by a rotatable shaft 302. The housing 301 is provided with a motor 304 for driving the rotatable shaft 302. The heating means or a heater 305 is mounted in the housing 301 so as to surround the valve body 303. The heater 305 is connected to an electronic supply not shown in the drawings. Moreover, the housing is provided with a thermocoupller 306 for controlling the temperature of the heater 305. Further, the heater 305 need not be formed of a resistance heating wire, and may be made of ceramics or any other suitable materials. Moreover, the heater 305 may be embedded in the wall or attached to the outside of the outer wall. Furthermore, the heater 305 may be located in- or outside the wall, or wound around the outer wall. The temperature of the heater 305 is a temperature at which the cleaning medium evaporates. Therefore, it is 100° C. or more in the case where the cleaning medium is pure water.

Figure 8A:
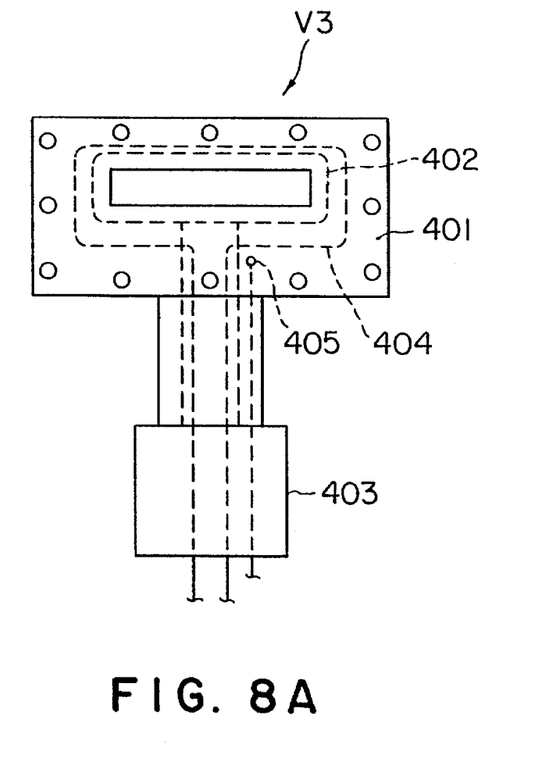
FIG. 8A is a front view of a gate valve.
Figure 8B:
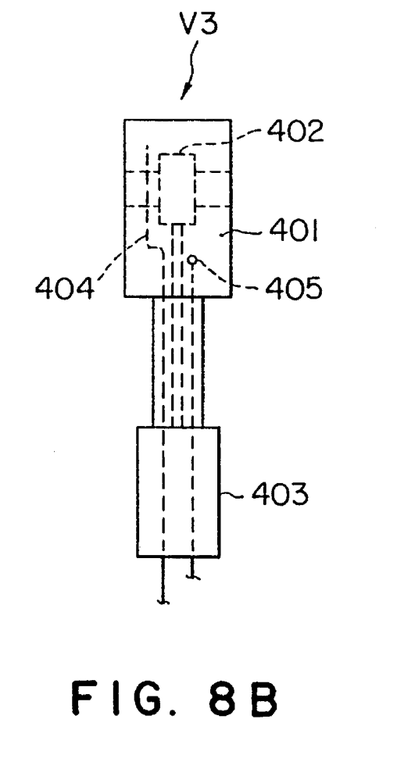
FIG. 8B is a side view thereof.

The upper gate valve V3 is constructed as shown in FIG. 8A and 8B. A gate valve housing 401 is provided with a valve body 402 which is slideable thereon. The housing 401 is provided with an air cylinder 403 for driving the valve body 402. The heating means or a heater 404 is mounted in the housing 401 so as to surround the valve body 402. Moreover, the housing 401 is provided with a thermocoupller 405 for controlling the temperature of the heater 404. Further, the heater 404 need not be formed of a resistance heating wire, and may be made of ceramics or any other suitable materials. Moreover, the heater 404 may be embedded in the wall or attached to the outside of the outer wall. Furthermore, the heater 404 may be located in- or outside the wall, or wound around the outer wall. The temperature of the heater 404 is a temperature at which the cleaning medium evaporates. Therefore, it is 100° C. or more in the case where the cleaning medium is pure water.

As the heating means is constructed as described above, after a predetermined quantity of the cleaning medium is discharged from the treatment chamber 101 and the exhaust pipe 112, the heater 107, together with the heater 305 and 404, is switched on to heat the chamber 101 and the exhaust pipe 112. When the treatment chamber 101 and the pipe 112 are thus heated, the cleaning medium therein evaporates. The resulting vapor is discharged through the vent hole 105 and the ventilating pipe 151. The wetness of the vapor in the pipe 161 is detected by means of a dew indicator (not shown) or the like. When a predetermined value is reached by the wetness of the vapor, therefore, the valves V5 and V6 are closed, the valve V3 is opened, and the treatment chamber 101 is evacuated through the exhaust pipe 112 by means of the vacuum pump 113. This is done in order to prevent dew condensation in the vacuum pump when the high-wetness vapor is sucked in by means of the pump.

What is claimed is:

1. A vacuum treatment apparatus for manufacturing a semiconductor device, wherein a semiconductor wafer is subjected to various treatments for manufacturing the semiconductor device, using treatment gases in an airtight treatment chamber having a substantial vacuum, so that reaction products are produced in the treatment chamber, said vacuum treatment apparatus comprising:

supply means for supplying a cleaning liquid into said treatment chamber after finishing one of the treatments, so that the interior of the chamber is cleaned by the liquid;

cleaning liquid discharge means for discharging the cleaning liquid from said treatment chamber; and heating means for heating and drying the interior of said chamber at least after discharging a predetermined quantity of the cleaning liquid.

2. A vacuum treatment apparatus according to claim 1, further comprising vapor discharge means for discharging vapor of the cleaning liquid produced when the interior of said chamber is heated after the predetermined quantity of the cleaning liquid is discharged.

3. A vacuum treatment apparatus according to claim 2, further comprising exhaust means for evacuating said chamber after the vapor of the cleaning liquid is discharged by means of the vapor discharge means.

4. A vacuum treatment apparatus according to claim 1, further comprising ventilating means for releasing a gas from said chamber into the atmosphere when the cleaning liquid is supplied into said chamber by means of the supply means.

5. A vacuum treatment apparatus according to claim 1, wherein said heating means includes a heater arranged on the wall of said chamber.

6. A vacuum treatment apparatus according to claim 1, further comprising a level gage for measuring the liquid level of the cleaning liquid when the cleaning medium is supplied into said chamber.

7. A vacuum treatment apparatus according to claim 1, wherein said cleaning liquid discharge means discharges the cleaning liquid after the supply means fills said chamber with the cleaning liquid.

8. A vacuum treatment apparatus according to claim 1, wherein said supply means supplies the cleaning liquid into said chamber to keep the liquid level fixed as the cleaning medium discharge means discharges the cleaning liquid.

9. A vacuum treatment apparatus according to claim 1, further comprising measuring means for measuring the specific resistance of the cleaning liquid.

10. A vacuum treatment apparatus according to claim 1, wherein said supply means includes an injection hole in the form of a nozzle or a shower head for injecting the cleaning liquid into said chamber.

11. A vacuum treatment apparatus according to claim 1, further comprising stirring means for stirring the cleaning liquid in said chamber.

12. A vacuum treatment apparatus according to claim 1, further comprising vibrating means for vibrating the cleaning liquid in said chamber.

13. A vacuum treatment apparatus according to claim 1, further comprising heating means for heating a gas exhaust system.

14. A vacuum treatment apparatus according to claim 1 further comprising an inlet gate formed in said treatment chamber for receipt of a wafer in said treatment chamber.

15. A vacuum treatment apparatus according to claim 1 further comprising a wafer mount positioned within said treatment chamber.

16. A vacuum treatment apparatus according to claim 1 wherein said supply means includes an injection pipe with a first valve, said cleaning liquid discharge means includes a discharge pipe with a second valve, and said vacuum treatment apparatus further comprising a controller for activating said first valve for initiating the supplying of a cleaning liquid into the treatment chamber after finishing one of the treatments, for activating said second valve for discharging said cleaning liquid after said treatment chamber is filled by said supply means, and for activating said heating means after said discharge means discharges the predetermined quantity of the cleaning liquid.

17. A vacuum treatment according to claim 1 further comprising, in addition to said supply means, a first and second reaction product gas introduction line opening into said treatment chamber.

18. A vacuum treatment apparatus for manufacturing a semiconductor device, wherein a semiconductor wafer is subjected to various treatments for manufacturing the semiconductor device, using treatment gases in an airtight treatment chamber having a substantial vacuum, so that reaction products resulting from reaction between components in the treatment gases or between the treatment gas components and the components of the wafer surface are produced in the treatment chamber, said vacuum treatment apparatus comprising:

supply means for supplying a cleaning liquid into the treatment chamber after finishing one of the treatments, so that the interior of the chamber is cleaned by the liquid;

cleaning liquid discharge means for discharging the cleaning liquid from the treatment chamber;

heating means for heating and drying the interior of said chamber after discharging a predetermined quantity of the cleaning liquid, so that vapor of the cleaning liquid is produced;

vapor discharge means for discharging the vapor of the cleaning liquid when the interior of the chamber is heated; and exhaust means for evacuating the chamber after the vapor of the cleaning liquid is discharged.

19. A vacuum treatment according to claim 18 further comprising an inlet gate formed in said treatment chamber for receipt of a wafer in said treatment chamber.

20. A vacuum treatment according to claim 18 further comprising a wafer mount positioned within said treatment chamber.

21. A vacuum treatment according to claim 18 further comprising, in addition to said supply means, a first and second reaction product gas introduction line opening into said treatment chamber.

* * * * *